(12) United States Patent
Liang et al.

(10) Patent No.: US 12,362,334 B2
(45) Date of Patent: Jul. 15, 2025

(54) INTERMEDIATE SUBSTRATE AND FABRICATION METHOD OF DISPLAY PANEL

(71) Applicant: BOE TECHNOLOGY GROUP CO., LTD., Beijing (CN)

(72) Inventors: Zhiwei Liang, Beijing (CN); Yingwei Liu, Beijing (CN); Guoqiang Wang, Beijing (CN); Muxin Di, Beijing (CN); Ke Wang, Beijing (CN); Hsuanwei Mai, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 730 days.

(21) Appl. No.: 17/279,488

(22) PCT Filed: May 28, 2020

(86) PCT No.: PCT/CN2020/092864
§ 371 (c)(1),
(2) Date: Mar. 24, 2021

(87) PCT Pub. No.: WO2021/237559
PCT Pub. Date: Dec. 2, 2021

(65) Prior Publication Data
US 2022/0199862 A1 Jun. 23, 2022

(51) Int. Cl.
*H01L 25/075* (2006.01)
*H10H 20/01* (2025.01)
(Continued)

(52) U.S. Cl.
CPC ......... *H01L 25/0753* (2013.01); *H10H 20/84* (2025.01); *H10H 29/142* (2025.01); *H10H 20/034* (2025.01)

(58) Field of Classification Search
CPC ... H01L 33/0093; H01L 33/005; H01L 33/56; H01L 25/0753; H01L 33/44; H01L 25/167; H01L 33/58; H01L 2933/0058
See application file for complete search history.

(56) References Cited

U.S. PATENT DOCUMENTS

2003/0162463 A1\* 8/2003 Hayashi ............... H01L 24/18
445/24
2011/0297980 A1 12/2011 Sugizaki et al.
(Continued)

FOREIGN PATENT DOCUMENTS

CN 102097341 A 6/2011
CN 105706257 A 6/2016
(Continued)

OTHER PUBLICATIONS

Office Action dated Jan. 14, 2025 issued in corresponding Chinese Application No. 202080000856.2.

*Primary Examiner* — Yara B Green
*Assistant Examiner* — Fakeha Sehar
(74) *Attorney, Agent, or Firm* — Nath, Goldberg & Meyer; Joshua B. Goldberg

(57) ABSTRACT

Embodiments of the present disclosure provide an intermediate substrate, including: a first substrate; a black photoresist layer on a side of the first substrate; and a plurality of light emitting devices on a side of the black photoresist layer away from the first substrate. Each of the plurality of light emitting devices has a light-exiting side for emergence of light emitted by the light emitting device, the light-exiting side is in contact with the black photoresist layer, and the light emitting device includes a driving electrode for introducing a driving signal.

17 Claims, 4 Drawing Sheets

(51) Int. Cl.
*H10H 20/84* (2025.01)
*H10H 29/14* (2025.01)

(56) References Cited

U.S. PATENT DOCUMENTS

| 2012/0058579 | A1 | 3/2012 | Horng et al. |
| 2014/0220714 | A1 | 8/2014 | Sorimachi |
| 2020/0273848 | A1* | 8/2020 | Zhong .................. H01L 25/167 |
| 2021/0066262 | A1* | 3/2021 | Liu ..................... H01L 33/0095 |

FOREIGN PATENT DOCUMENTS

| CN | 107978548 A | 5/2018 |
| CN | 108258006 A | 7/2018 |
| CN | 109300931 A | 2/2019 |
| CN | 110546751 A | 12/2019 |
| CN | 110993749 A | 4/2020 |
| JP | 2020043195 A | 3/2020 |

* cited by examiner

INTERMEDIATE SUBSTRATE AND FABRICATION METHOD OF DISPLAY PANEL

CROSS-REFERENCE TO RELATED APPLICATION

This is a National Phase Application filed under 35 U.S.C. 371 as a national stage of PCT/CN2020/092864, filed on May 28, 2020, the entire contents of which are hereby incorporated by reference.

TECHNICAL FIELD

Embodiments of the present disclosure relate to the field of display technology, in particular to an intermediate substrate and a method for fabricating a display panel.

BACKGROUND

Light Emitting Diode (LED) display technology is receiving increasing attention due to its advantages, such as high dynamic contrast, high brightness.

The light emitting diode display panel includes a driving substrate with a driving circuit. A plurality of light emitting diodes may be first fabricated on other substrates (e.g., sapphire substrates) and then "transferred (e.g., massive-transferred)" to the driving substrate, i.e., the light emitting diodes are separated from the original substrate and electrically connected to the driving circuit on the driving substrate, while the physical connection between the light emitting diodes and the driving substrate is also achieved, for example, the cathodes and anodes of the light emitting diodes are electrically connected to the corresponding driving pads, respectively. In order to avoid crosstalk (or color mixing) of light emitted from different light emitting devices (and different pixels or sub-pixels), it is necessary to form a Black Matrix (BM) in gaps between different light emitting devices.

Therefore, the fabrication of the light emitting diode display panel includes a plurality of steps of the transfer of the light emitting diodes, the fabrication of the black matrix and the like, so that the fabrication process thereof is complex, the cost is high and the efficiency is low.

SUMMARY

Embodiments of the present disclosure provide an intermediate substrate and a method for fabricating a display panel.

In a first aspect, an embodiment of the present disclosure provides an intermediate substrate, including: a first substrate; a black photoresist layer on a side of the first substrate; a plurality of light emitting devices on a side of the black photoresist layer away from the first substrate; where each of the plurality of light emitting devices has a light-exiting side for emergence of light emitted by the light emitting device, the light-exiting side is in contact with the black photoresist layer, and the light emitting device includes a driving electrode for introducing a driving signal.

In some embodiments, the light emitting device has a connection side opposite to the light-exiting side, and the driving electrode is provided at the connection side.

In some embodiments, the light emitting device is a light emitting diode, and the driving electrode includes a cathode and an anode which are arranged at an interval.

In some embodiments, a thickness of the black photoresist layer is substantially the same as a thickness of the light emitting device.

In some embodiments, the black photoresist layer includes: silica gel; and carbon black distributed in the silica gel.

In some embodiments, a first alignment mark is further provided on the first substrate.

In some embodiments, the first substrate is made of a transparent material.

In a second aspect, an embodiment of the present disclosure provides a method for fabricating a display panel, including:

providing a driving substrate and an intermediate substrate; where the driving substrate includes a second substrate, and a driving circuit is disposed on a side of the second substrate and includes a plurality of driving pads; and where the intermediate substrate includes: a first substrate; a black photoresist layer on a side of the first substrate; and a plurality of light emitting devices on a side of the black photoresist layer away from the first substrate, each of the plurality of light emitting devices having a light-exiting side for emergence of light emitted by the light emitting device, the light-exiting side being in contact with the black photoresist layer, and the light emitting device including a driving electrode for introducing a driving signal;

arranging a side of the intermediate substrate provided with the plurality of light emitting devices to face a side of the driving substrate provided with the driving circuit, so as to electrically connect driving electrodes of at least some of the plurality of light emitting devices to driving pads of the plurality of driving pads; and pressing the first substrate and the second substrate to embed the light emitting device into the black photoresist layer until the light-exiting side of the light emitting device is exposed, where the black photoresist layer forms a black matrix.

In some embodiments, the light emitting device has a connection side opposite to the light-exiting side, and the driving electrode is provided at the connection side.

In some embodiments, a first alignment mark is further provided on the first substrate, and a second alignment mark is further provided on the second substrate; the step of arranging the side of the intermediate substrate provided with the plurality of light emitting devices to face the side of the driving substrate provided with the driving circuit, includes: arranging the side of the intermediate substrate provided with the plurality of light emitting devices to face the side of the driving substrate provided with the driving circuit, and aligning the first alignment mark with the second alignment mark.

In some embodiments, the step of pressing the first substrate and the second substrate, includes: pressing the first substrate and the second substrate in a heated vacuum environment; and curing the black photoresist layer in a heated inert gas environment.

In some embodiments, the first substrate is made of a transparent material, and the first substrate is a cover plate of the display panel.

In some embodiments, after the step of pressing the first substrate and the second substrate, the method further includes: separating the first substrate from the black matrix and the light emitting device.

BRIEF DESCRIPTION OF THE DRAWINGS

The accompanying drawings are included to provide a further understanding of the embodiments of the present disclosure, and are incorporated in and constitute a part of this specification, explain the present disclosure together with the embodiments of the present disclosure and are not to limit the present disclosure. The above and other features and advantages will become more apparent to those skilled in the art by describing in detail exemplary embodiments thereof with reference to the accompanying drawings, in which.

Figure 1:
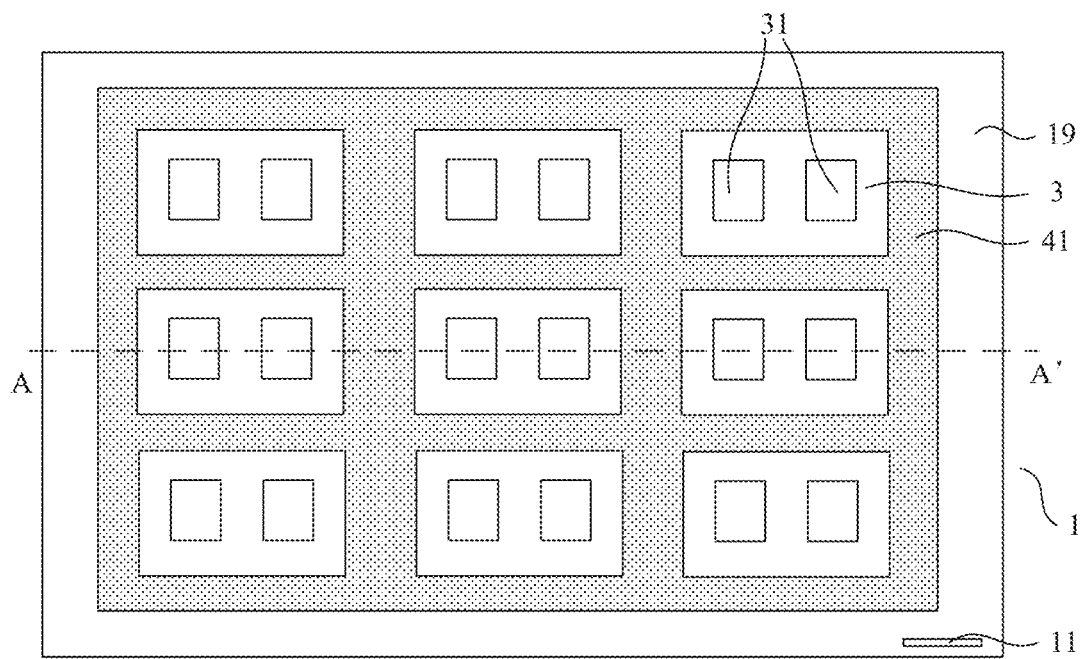
FIG. 1 is a schematic structural diagram illustrating a top view of an intermediate substrate according to an embodiment of the present disclosure.

REFERENCE NUMERALS 1. an intermediate substrate; 11. a first alignment mark; 19. a first substrate; 2. a driving substrate; 21. a driving pad; 22. a second alignment mark; 29. a second substrate; 3. a light emitting device; 31. a driving electrode; 391. a light-exiting side; 392. a connection side; 41. a black photoresist layer; 42. a black matrix; 6. a display panel; 79. a third substrate; and 9. a conductive adhesive.

DETAILED DESCRIPTION

In order to make those skilled in the art better understand the technical solutions of the embodiments of the present disclosure, an intermediate substrate and a method for fabricating a display panel provided in the embodiments of the present disclosure will be described in detail with reference to the accompanying drawings.

The embodiments of the present disclosure will be described more fully hereinafter with reference to the accompanying drawings, but the embodiments shown may be embodied in different forms and should not be construed as being limited to the embodiments set forth herein. Rather, these embodiments are provided so that this disclosure will be thorough and complete, and will fully convey the scope of the present disclosure to those skilled in the art.

Embodiments of the present disclosure may be described with reference to plan and/or cross-sectional views by way of idealized schematic illustrations of the present disclosure. Accordingly, the exemplary illustrations may be modified in accordance with fabricating techniques and/or tolerances.

Embodiments of the present disclosure and features of the embodiments may be combined with each other without conflict.

The terminology used in the present disclosure is for the purpose of describing particular embodiments only and is not intended to limit the present disclosure. As used in this disclosure, the term "and/or" includes any and all combinations of one or more of the associated listed items. As used in this disclosure, the singular forms "a", "an" and "the" are intended to include the plural forms as well, unless the context clearly indicates otherwise. The terms "includes," "including," "made of . . . ," as used in this disclosure, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used in this disclosure have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The embodiments of the present disclosure are not limited to the embodiments shown in the drawings, but include modifications of configurations formed based on fabricating processes. Thus, the regions illustrated in the figures have schematic properties, and the shapes of the regions shown in the figures illustrate specific shapes of regions of elements, but are not intended to be limiting.

In a first aspect, referring to FIGS. 1 to 8, an embodiment of the present disclosure provides an intermediate substrate 1.

The intermediate substrate 1 in the embodiment of the present disclosure is used for fabricating a display panel 6, particularly a Light Emitting Diode (LED) display panel.

The intermediate substrate 1 according to the embodiment of the present disclosure includes: a first substrate 19; a black photoresist layer 41 provided on a side of the first substrate 19; and a plurality of light emitting devices 3 arranged on a side of the black photoresist layer 41 away from the first substrate 19. The light emitting device 3 has a light-exiting side 391 for emergence of light emitted by the light emitting device 3, and the light-exiting side 391 is in contact with the black photoresist layer 41. The light emitting device 3 includes a driving electrode 31 for introducing a driving signal.

Figure 2:
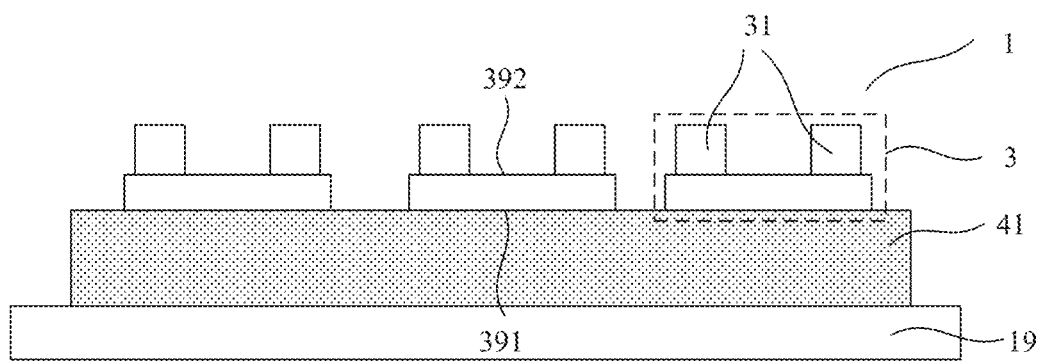
FIG. 2 is a schematic cross-sectional view taken along line AA' of FIG. 1.

Referring to FIGS. 1 and 2, the intermediate substrate 1 according to the embodiment of the present disclosure includes the first substrate 19.

The first substrate 19 is provided with a black photoresist layer 41, i.e. a layer made of opaque black material capable of blocking all visible light. That is to say, the material of the black photoresist layer 41 is the material making up a black matrix (BM), but the black photoresist layer 41 is a whole layer and is not in the form of a "Matrix".

A plurality of light emitting devices 3, each of which can emit light when energized and serves as one pixel (or sub-pixel) of the display panel 6, are also provided on the whole black photoresist layer 41. One side of the light emitting device 3, i.e., the "outward" side (towards the user)

of the display panel 6, is the light-exiting side 391 for emergence of light. The light emitting device 3 is further provided with the driving electrode 31, and by connecting the driving electrode 31 to a driving pad 21 of a driving circuit, a driving signal can be introduced into the light emitting device 3 to drive the light emitting device 3 to emit light with a desired brightness for display.

Referring to FIG. 2, the light emitting device 3 is disposed on the black photoresist layer 41 in such a manner that the light-exiting side 391 is in contact with the black photoresist layer 41.

Here, the plurality of light emitting devices 3 are usually arranged in an "array", or the distribution of the light emitting devices 3 is the same as the distribution of the pixels (or sub-pixels) in the display panel 6.

In the embodiment of the present disclosure, the intermediate substrate 1 is provided with the black photoresist layer 41 and the light emitting devices 3 at the same time, so that the black photoresist layer 41 can be transferred onto the driving substrate 2 simultaneously in the process of "transferring" the light emitting devices 3 onto the driving substrate 2 provided with the driving circuit and electrically connecting the light emitting devices 3 to the driving pads 21, and the black matrix 42 (BM) can be formed by using the black photoresist layer 41. Therefore, in the embodiment of the present disclosure, the transfer of the light emitting devices 3 and the fabrication of the black matrix 42 can be completed in one process, thereby simplifying the fabrication process of the display panel 6, reducing the fabrication cost, and improving the fabrication efficiency.

In some embodiments, the light emitting device 3 has a connection side 392 opposite to the light-exiting side 391, and the driving electrode 31 is provided at the connection side 392.

Referring to FIG. 2, the side of the light emitting device 3 opposite to the light-exiting side 391 is a connection side 392, i.e., the side "facing" the driving substrate 2; and the driving electrode 31 of the light emitting device 3 is provided on the connection side 392, so that the driving electrode 31 is "exposed" for direct contact and connection with the driving pad 21 of the driving circuit.

Of course, it is also possible to provide the driving electrode 31 at other positions of the light emitting device 3.

For example, some of the driving electrodes 31 may be located on the light-exiting side 391 (i.e., the light emitting device 3 is of a vertical structure) and used for electrically connecting with a driving structure on the cover plate of the display panel 6; alternatively, the light emitting device 3 may further include an outer side surface connecting the light-exiting side 391 and the connection side 392, and the driving electrode 31 may be disposed on the outer side surface.

In some embodiments, the light emitting device 3 is a light emitting diode, and the driving electrodes 31 are a cathode and an anode which are arranged at an interval.

As an implementation of the embodiment of the present disclosure, the light emitting device 3 may be a Light Emitting Diode (LED), that is, the intermediate substrate 1 may be used for fabricating a light emitting diode display panel. Accordingly, the driving electrodes 31 of the light emitting device 3 in this case are the cathode and the anode (or the positive electrode and the negative electrode) of the light emitting diode.

The light emitting diode display panel has wide application. It can be used for conventional display screens (such as computer display screens, mobile phone display screens and the like), can also be used for Virtual Reality (VR) display or Augmented Reality (AR) display, and can also be used for large-size display, such as billboards, movie screens and the like. Moreover, the LED display panel may be a rigid display panel or a deformable flexible display panel.

In some embodiments, the light emitting diode is a millimeter-scale light emitting diode or a submillimeter-scale light emitting diode.

Further, the light emitting diode device may be a light emitting diode with a smaller size, such as a millimeter-scale light emitting diode (Micro-LED) or a submillimeter-scale light emitting diode (Mini-LED), so as to improve the resolution of the corresponding display panel 6 and improve the display effect.

Generally, the size of a millimeter-scale light emitting diode (Micro-LED) (based on the maximum size of the light-exiting side 391 in any direction) may be 100 μm or more, for example, 120 μm; while the size of the submillimeter-scale light emitting diode (Mini-LED) may be 100 μm or less, for example, 50 μm.

In some embodiments, the thickness of the black photoresist layer 41 is substantially the same as the thickness of the light emitting device 3.

Referring to FIG. 2, the thickness (the dimension in the direction perpendicular to the first substrate 19) of the black photoresist layer 41 may be set as required, but since the black photoresist layer 41 needs to be "squeezed" into the space between the light emitting devices 3 to form the black matrix 42, the thickness of the black photoresist layer 41 should be substantially the same as the thickness of the light emitting device 3 to ensure that the subsequently formed black matrix 42 is substantially "flush" with the light emitting device 3, i.e., to achieve a sufficient light blocking effect and not to "bury" the light emitting device 3.

Here, the above "substantially the same" means that the thickness of the black photoresist layer 41 may be in a range of 85% to 115%, further in a range of 90% to 110%, further in a range of 95% to 105%, with the thickness of the light emitting device 3 being 100%.

For example, if the light emitting device 3 (e.g., Micro-LED) excluding an epitaxial substrate typically has a thickness around 10 μm; and the light emitting device 3 (such as a Mini-LED) including an epitaxial substrate typically has a thickness ranging from 200 μm to 300 μm, so the thickness of the black photoresist layer 41 may range from 10 μm to 300 μm.

Thickness differences among different structures in the driving circuit are small, and the thickness differences may be basically not considered in determination of the thickness of the black photoresist layer 41.

In some embodiments, the black photoresist layer 41 includes: silica gel; and carbon black distributed in the silica gel.

In some embodiments, the mass percentage of the carbon black in the black photoresist layer 41 is between 10% and 80%.

The material of the black photoresist layer 41 may specifically be silica gel and carbon black (black pigment) mixed therein. The amount of the carbon black may be set as required (the larger the amount of the carbon black, the "more black" the black photoresist layer 41 is, and the better the light-blocking effect is), but generally, the mass percentage of the carbon black may be 10% to 80%.

Specifically, the black photoresist layer 41 may be fabricated by using an adhesive film having a predetermined thickness, which is an independent film layer composed of the silica gel and the carbon black, both sides of which may have tackiness, and to which release films (e.g., PET films)

are respectively attached. Specifically, the release film on one side of the adhesive film is removed to adhere the adhesive film to the first substrate 19 to form the black photoresist layer 41, and then the release film on the other side of the adhesive film is removed to dispose the light emitting device 3 (such as a light emitting diode) on the black photoresist layer 41 (e.g., adhere the light emitting device 3 to the black photoresist layer 41).

In some embodiments, a first alignment mark 11 is further provided on the first substrate 19.

Referring to FIG. 1, the first alignment mark 11 may be further formed on the first substrate 19, and the first alignment mark 11 is used for aligning with a second alignment mark 22 of the driving substrate 2, so as to ensure that each light emitting device 3 of the intermediate substrate 1 can be accurately connected to a corresponding driving pad 21 of the driving substrate 2.

The first alignment mark 11 and the second alignment mark 22 should be able to cooperate with each other, and the specific form thereof is various.

For example, the first alignment mark 11 and the second alignment mark 22 may include mutually matching patterns, for example, one of them includes a plurality of "cross" patterns disposed at different positions (such as four corners of the substrate), and the other includes a plurality of patterns disposed at corresponding positions, each having a "cross" shaped opening, which will not be described in detail herein.

For example, the first alignment mark 11 may also be a larger pattern, such as an alignment frame, to be opposite to the corresponding second alignment mark 22.

In some embodiments, the first substrate 19 is made of a transparent material.

As an implementation of the embodiment of the present disclosure, the first substrate 19 may be made of a transparent material, thereby allowing light emitted from the light emitting device 3 to pass therethrough. Thus, the first substrate 19 does not have to be separated when the display panel 6 is fabricated, but may be left in the display panel 6 as a cover plate (or an opposite substrate) of the display panel 6 to protect the light emitting device 3 and other display structures.

Thus, in the embodiment of the present disclosure, three processes of the transfer of the light emitting device 3, the fabrication of the black matrix 42, and the assembly of the cover plate are completed through one process step, so as to further simplify the fabrication process of the display panel 6, reduce the fabrication cost, and improve the fabrication efficiency.

Meanwhile, according to the above manner, the black matrix 42 may also have a function of bonding and thus fixing the first substrate 19 (cover plate); accordingly, a separate overcoat layer (OC) for adhering the cover plate is not required to be fabricated in the display panel 6, and the structure of the display panel 6 is also simplified.

In some embodiments, the transparent material is glass.

Specifically, the first substrate 19 (i.e., the cover plate of the display panel 6) may be made of glass, for example, glass with a thickness of 0.2 mm to 0.5 mm.

Of course, it is also possible to make the first substrate 19 by using other transparent materials such as transparent polyimide (CPI), transparent polyethylene terephthalate (PET), and the like.

In a second aspect, referring to FIGS. 1 to 8, an embodiment of the present disclosure provides a method for fabricating a display panel 6.

The fabrication method of the embodiment of the present disclosure is used for fabricating the display panel 6 using any one of the above intermediate substrates 1.

The fabrication method of the display panel 6 in the embodiment of the present disclosure includes: S201, providing a driving substrate 2 and an intermediate substrate 1.

The driving substrate 2 includes a second substrate 29, and a driving circuit is disposed on a side of the second substrate 29 and includes a plurality of driving pads 21.

The intermediate substrate 1 includes: a first substrate 19; a black photoresist layer 41 provided on a side of the first substrate 19; and a plurality of light emitting devices 3 arranged on a side of the black photoresist layer 41 away from the first substrate 19. The light emitting device 3 has a light-exiting side 391 for emergence of light emitted by the light emitting device 3, and the light-exiting side 391 is in contact with the black photoresist layer 41. The light emitting device 3 includes a driving electrode 31 for introducing a driving signal.

Referring to FIGS. 1 to 4, a driving substrate 2 and an intermediate substrate 1 are fabricated separately.

The intermediate substrate 1 is any one of the intermediate substrates 1 described above, and will not be described in detail herein.

Figure 3:
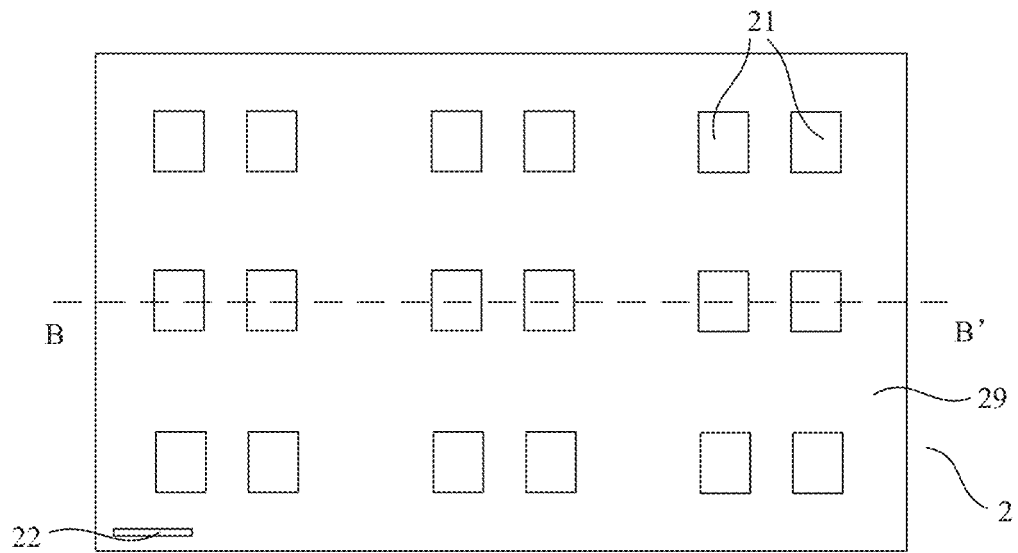
FIG. 3 is a schematic structural diagram illustrating a top view of a driving substrate used in a method for fabricating a display panel according to an embodiment of the present disclosure.
Figure 4:
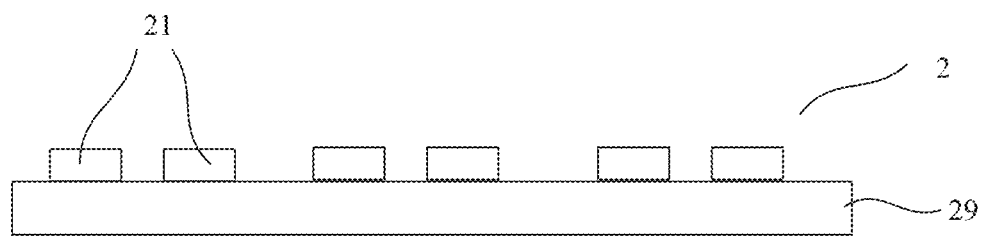
FIG. 4 is a schematic cross-sectional view taken along line BB' of FIG. 3.

Referring to FIGS. 3 and 4, the driving substrate 2 includes a second substrate 29 and a driving circuit disposed on the second substrate 29.

The driving circuit is a circuit capable of driving the light emitting device 3 (such as a light emitting diode) to emit light with a desired brightness for display.

Specifically, the driving circuit includes driving pads 21 for connecting to driving electrodes 31 (e.g., a cathode and an anode of a light emitting diode) of the light emitting device 3, and other parts, such as a gate line, a data line, a storage capacitor (Cst), a transistor (TFT), and the like, for supplying a driving signal to the driving pad 21. The specific form of the driving circuit is various and will not be described in detail here.

The driving circuit is not a complete layer, and is not shown in the figures, but only the driving pads 21 therein are schematically shown.

The driving substrate 2 and the intermediate substrate 1 may be purchased products or directly fabricated products, and are not described in detail here.

The method further includes: S202, arranging the side of the intermediate substrate 1 provided with the light emitting devices 3 to face the side of the driving substrate 2 provided with the driving circuit, so that the driving electrodes 31 of at least some of the light emitting devices 3 are electrically connected to the driving pads 21 of the driving circuit.

Figure 5:
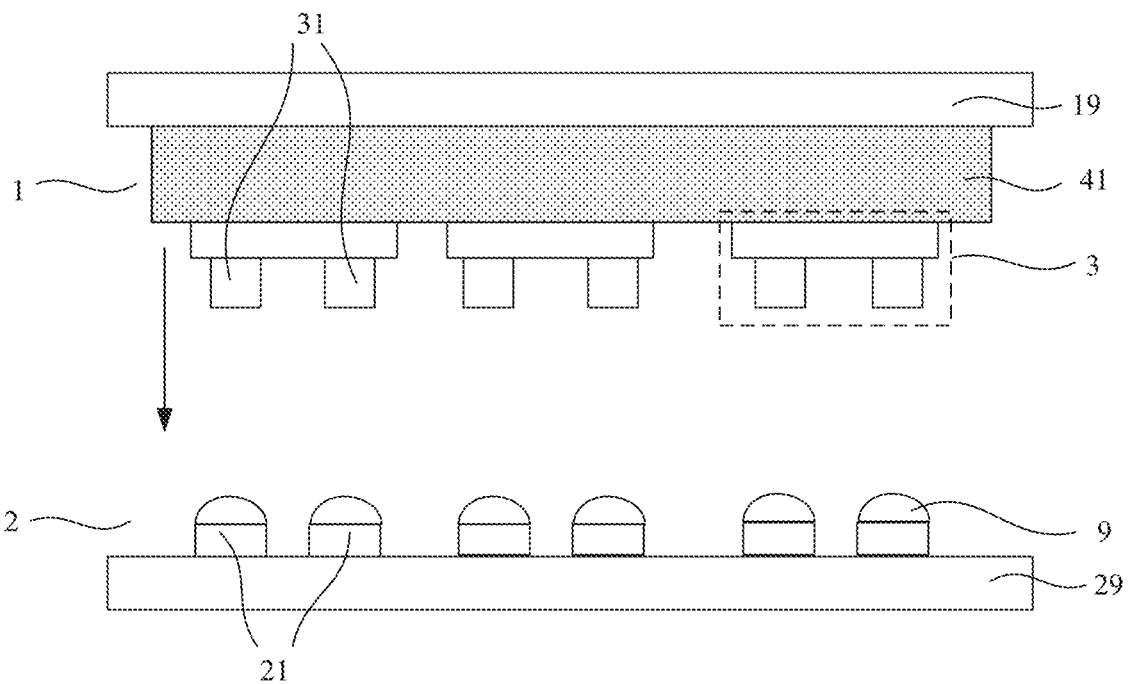
FIG. 5 is a schematic cross-sectional view illustrating arranging an intermediate substrate to face a driving substrate in a method for fabricating a display panel according to an embodiment of the present disclosure.
Figure 6:
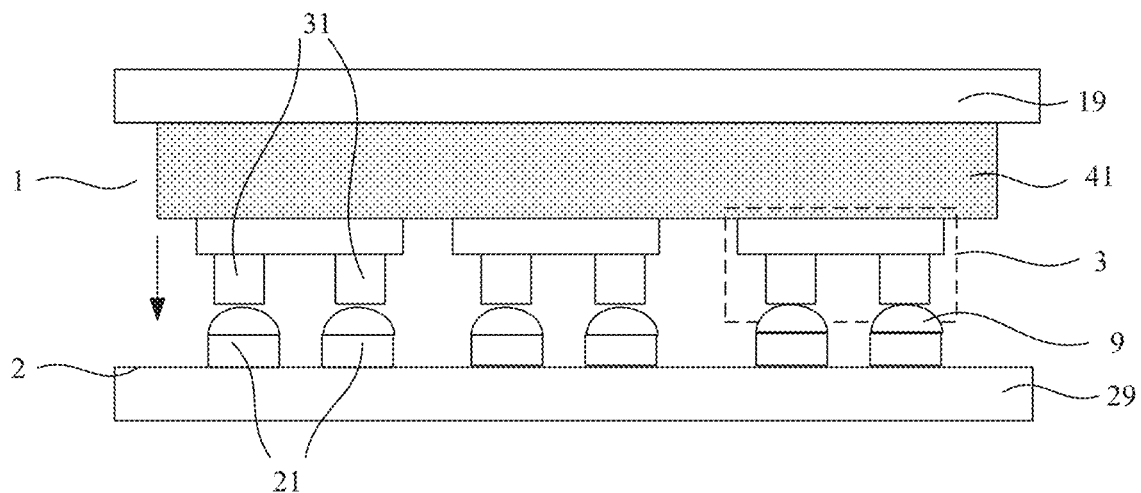
FIG. 6 is a schematic cross-sectional view illustrating an intermediate substrate and a driving substrate before bonding in a method for fabricating a display panel according to an embodiment of the present disclosure.

Referring to FIGS. 5 and 6, the side of the intermediate substrate 1 provided with the light emitting devices 3 faces the side of the driving substrate 2 provided with the driving circuit, and the driving electrodes 31 of the light emitting devices 3 are electrically connected to the corresponding driving pads 21 of the driving circuits by bringing them closer.

For example, the driving substrate 2 may be disposed on a base of a pressure-bearing laminator with its side having the driving circuit facing upward; the side of the intermediate substrate 1 where the light emitting device 3 is disposed is positioned (e.g., sucked) downward, and the driving electrode 31 and the driving pad 21 are gradually brought closer to each other.

Of course, it will be appreciated that when some of the driving electrodes 31 are not provided on the side facing the driving substrate 2, these driving electrodes 31 may also be electrically connected to other driving structures (e.g. driving structures provided on the cover plate).

The method further includes: S203, pressing the first substrate 19 and the second substrate 29 to embed the light emitting device 3 into the black photoresist layer 41 until the light-exiting side 391 of the light emitting device 3 is exposed, where the black photoresist layer 41 forms the black matrix 42.

Referring to FIGS. 5 and 6, after the driving electrode 31 is electrically connected to the driving pad 21, the first substrate 19 is continuously "pressed" against the second substrate 29 (i.e., "pressing").

Since the black photoresist layer 41 is of a relatively soft and deformable material, and the driving electrode 31 and the driving pad 21 are relatively fixed structures, the black photoresist layer 41 is pressed and deformed to "squeeze" into the gaps between different light emitting devices 3 (including the gaps between different driving electrodes 31 of the light emitting devices 3); at the same time, the black photoresist layer 41, which is originally located between the light-exiting side 391 of the light emitting device 3 and the first substrate 19, is gradually "squeezed out", thereby "exposing" the light-exiting side 391 of the light emitting device 3.

Figure 7:
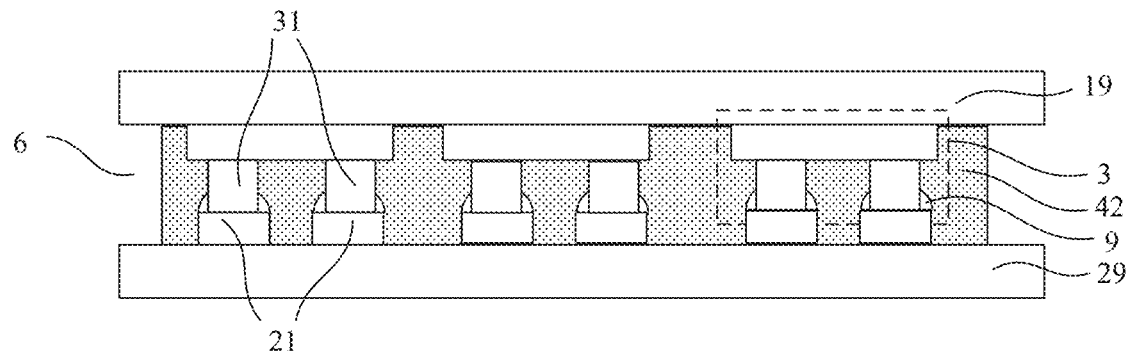
FIG. 7 is a schematic cross-sectional view of a display panel fabricated by a method for fabricating a display panel according to an embodiment of the present disclosure.

Finally, referring to FIG. 7, the light-exiting side 391 of the light emitting device 3 is in contact with the first substrate 19, so that the light emitted therefrom can be directly emitted for display; adjacent light emitting devices 3 are filled with the black photoresist layer 41 therebetween to prevent crosstalk and color mixing of different pixels (sub-pixels), so that the black photoresist layer 41 distributed between adjacent light emitting devices 3 forms a "black matrix 42". As a result, the display panel 6 is obtained.

Of course, it should be understood that, a very small amount of the black matrix may remain on the light-exiting side 391 of the light emitting device 3 due to process limitations, but since the remaining black matrix is very thin, it cannot be formed into a specific structure in terms of process, and since the very thin black matrix has a high transmittance, it does not affect the emergent light from the light-exiting side 391 to the outside of the display panel 6 for display, and thus, the remaining black matrix should be regarded as not being present, i.e., the light-exiting side 391 of the light emitting device 3 is still regarded as "exposed".

Figure 8:
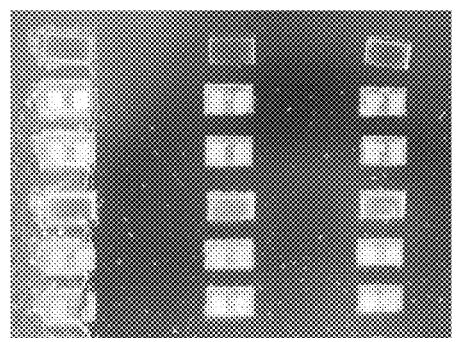
FIG. 8 is a photograph of a display panel fabricated by a method for fabricating a display panel according to an embodiment of the present disclosure.

Referring to the partial photograph of the display panel 6 in FIG. 8, in which the black portion having a large area is the black matrix 42 and the lighter colored rectangles are the light-exiting sides 391 of the respective light emitting devices 3, it can be seen that the light-exiting sides 391 of the light emitting devices 3 are very clear, which indicates that substantially no black matrix remains on the light emitting devices 3, i.e., it demonstrates that "exposure" of the light-exiting sides 391 of the light emitting devices 3 can be achieved by the method in the embodiment of the present disclosure.

For example, the structure of the display panel 6 fabricated by the method in the embodiment of the present disclosure may refer to FIG. 7, which may be specifically any product or component having a display function, such as an electronic paper, a mobile phone, a tablet computer, a television, a display, a notebook computer, a digital photo frame, a navigator, a Virtual Reality (VR) display device, an augmented reality (VR) display device, and the like; and may be a rigid or flexible display panel (depending on whether the first substrate 19 and the second substrate 29 are rigid or flexible).

In the embodiment of the present disclosure, the transfer (electrical connection) of the light emitting device 3 and the fabrication of the black matrix 42 can be simultaneously completed by one process step of pressing the first substrate 19 provided with the black photoresist layer 41 and the light emitting device 3 against the driving substrate 2, thereby simplifying the fabrication process of the display panel 6 (such as a light emitting diode display panel), reducing the fabrication cost, and improving the fabrication efficiency.

In some embodiments, the light emitting device 3 has a connection side 392 opposite to the light-exiting side 391, and the driving electrode 31 is provided at the connection side 392.

As mentioned above, when the driving electrodes 31 of the light emitting devices 3 are all disposed on the connection side 392, the driving electrodes 31 are all directly "facing" the driving substrate 2 to be in direct contact with the driving pads 21 for electrical connection.

In some embodiments, the first substrate 19 is further provided with a first alignment mark 11; and the second substrate 29 is further provided with a second alignment mark 22.

The step S202 of arranging the side of the intermediate substrate 1 provided with the light emitting devices 3 to face the side of the driving substrate 2 provided with the driving circuit includes: S2021, arranging the side of the intermediate substrate 1 provided with the light emitting devices 3 to face the side of the driving substrate 2 provided with the driving circuit, and aligning the first alignment mark 11 with the second alignment mark 22.

Referring to FIGS. 1 and 3, when the first substrate 19 is further provided with the first alignment mark 11, the second substrate 29 is also provided with the corresponding second alignment mark 22, so that the first alignment mark 11 and the second alignment mark 22 can be aligned first to ensure that the relative positions of the intermediate substrate 1 and the driving substrate 2 are accurate, the driving electrode 31 of each light emitting device 3 corresponds to the corresponding driving pad 21, and then the driving electrode 31 of the light emitting device 3 is electrically connected to the driving pad 21 of the driving circuit, thereby ensuring the connection accuracy.

In some embodiments, the step S202 of arranging the side of the intermediate substrate 1 provided with the light emitting devices 3 to face the side of the driving substrate 2 provided with the driving circuit, so that the driving electrodes 31 of the light emitting devices 3 are electrically connected to the driving pads 21 of the driving circuit, includes: S2022, disposing a conductive adhesive 9 on a side of the driving pad 21 away from the second substrate 29, and arranging the side of the intermediate substrate 1 provided with the light emitting devices 3 to face the side of the driving substrate 2 provided with the driving circuit, so that the driving electrode 31 of the light emitting device 3 is electrically connected to the driving pad 21 of the driving circuit through the conductive adhesive 9.

Referring to FIGS. 5 to 7, in order to electrically connect the driving pad 21 and the driving electrode 31, one method is to apply a conductive adhesive 9 on each driving pad 21 in advance, and then to make the intermediate substrate 1 and the driving substrate 2 face and approach each other, so that the driving electrode 31 of the light emitting device 3 is also in contact with the conductive adhesive 9, and the driving electrode 31 of the light emitting device 3 and the driving pad 21 of the driving circuit are electrically connected through the conductive adhesive 9 (and are physically bonded through the conductive adhesive 9, of course).

For example, the conductive adhesive 9 may be an Anisotropic Conductive Adhesive (ACA), which is mainly used for conduction in a direction from the driving electrode 31 to the driving pad 21.

For example, the conductive adhesive 9 may be applied to the driving pad 21 by various ways, such as by IJP printing (ink jet printing), or by dispensing, etc.

Of course, the specific manner of electrically connecting (including physically connecting) the driving electrode 31 and the driving pad 21 is various.

For example, a "micro tube" made of a harder conductive material (e.g., titanium metal) and having an opening at its upper end may be disposed on the driving pad 21, and at least a portion of the driving electrode 31 in contact with the driving pad 21 may be made of a softer conductive material (e.g., aluminum metal), so that the "micro tube" may be "inserted" into the softer conductive material of the driving electrode 31 to simultaneously complete the physical and electrical connection between the driving electrode 31 and the driving pad 21.

Of course, it is also possible to electrically connect the driving electrode 31 and the driving pad 21 by other means.

In some embodiments, the step S203 of pressing the first substrate 19 and the second substrate 29 includes: S2031, pressing the first substrate 19 and the second substrate 29 in a heated vacuum environment; and S2032, curing the black photoresist layer 41 in a heated inert gas environment.

When the first substrate 19 and the second substrate 29 are pressed, heating and vacuum-pumping can be performed, so that the black photoresist layer 41 can better enter gaps between different light emitting devices 3, and gas is prevented from being enclosed in the gaps to generate bubbles; in addition, the heating is also advantageous for curing the conductive adhesive 9 (such as ACA).

After the pressing, the black photoresist layer 41 is cured and shaped by further heating in the inert gas environment to form the black matrix 42 in the display panel 6.

In some embodiments, the heated vacuum environment has a temperature of 100° C. to 140° C. and the pressure of the pressing is 0.1 MPa to 1 MPa.

The temperature during the pressing may be between 100° C. and 140° C., for example, at 110° C.; and the vacuum environment can be realized by vacuum-pumping for about 100 seconds.

The pressure of the pressing (i.e., the ratio of the pressure applied to the intermediate substrate 1 and the area of the intermediate substrate 1) may be adjusted according to the effect of the black photoresist layer 41 entering the gaps between the different light emitting devices 3, and may be typically 0.1 MPa to 1 MPa, for example, 0.6 MPa.

The pressure of the pressing may be realized in various different ways.

For example, the space between the intermediate substrate 1 and the driving substrate 2 may be vacuumized, and the side of the intermediate substrate 1 away from the driving substrate 2 is at atmospheric pressure, so as to generate the required pressure for pressing by the pressure difference between two sides of the intermediate substrate 1.

Alternatively, both the intermediate substrate 1 and the driving substrate 2 may be placed in a vacuum chamber, and a pressure required for pressing may be generated by applying a pressure to the intermediate substrate 1 by a mechanical structure.

In some embodiments, the temperature of the heated inert gas environment is between 150° C. and 200° C., and the inert gas is nitrogen; the black photoresist layer 41 is cured for 1 to 3 hours.

After the pressing, the curing may be achieved by using nitrogen ($N_2$) as an inert gas and performing heating at 150-200° C. for 2-3 hours, for example, at 170° C. for 2 hours.

In some embodiments, the first substrate 19 is made of a transparent material; and the first substrate 19 is a cover plate of the display panel 6.

As an implementation of the embodiment of the present disclosure, when the first substrate 19 is made of a transparent material (such as glass), after the pressing process is completed, the first substrate 19 may be left in the display panel 6 as a cover plate (or an opposite substrate) of the display panel 6.

Therefore, according to the above manner, three processes of the transfer of the light emitting device 3, the fabrication of the black matrix 42, and the assembly of the cover plate are completed through one process step, so as to further simplify the fabrication process of the display panel 6, reduce the fabrication cost, and improve the fabrication efficiency Meanwhile, according to the above manner, the black matrix 42 may also have a function of bonding and thus fixing the first substrate 19 (cover plate); accordingly, a separate overcoat layer (OC) for adhering the cover plate is not required to be fabricated in the display panel 6, and the structure of the display panel 6 is also simplified.

In some embodiments, after the step 203 of pressing the first substrate 19 and the second substrate 29, the method further includes: S204, separating the first substrate 19 from the black matrix 42 and the light emitting device 3.

As another implementation of the embodiment of the present disclosure, instead of using the first substrate 19 as a cover plate, after the pressing process is completed, the first substrate 19 may be subsequently separated from the black matrix 42 and the light emitting device 3, so as to be "removed" therefrom. As a result, subsequent steps, such as assembling with a cover plate, may be performed.

When the light-exiting side 391 of the light emitting device 3 has the driving electrode 31, a corresponding driving structure may be disposed on the assembled cover plate, so as to be electrically connected to the driving electrode 31.

In a third aspect, referring to FIGS. 1 to 9, an embodiment of the present disclosure provides a method for fabricating an intermediate substrate 1.

The method in the embodiment of the present disclosure is used for fabricating any one of the above intermediate substrates 1, and the intermediate substrate 1 can be used in subsequent fabrication process of the display panel 6.

The method for fabricating the intermediate substrate 1 according to the embodiment of the present disclosure includes: S301, forming a black photoresist layer 41 on a side of the first substrate 19; and S302, providing a plurality of light emitting devices 3 on the black photoresist layer 41.

The light emitting device 3 has a light-exiting side 391 for emergence of light emitted by the light emitting device 3, and the light-exiting side 391 is in contact with the black photoresist layer 41. The light emitting device 3 includes a driving electrode 31 for introducing a driving signal.

In some embodiments, the light emitting device 3 has a connection side 392 opposite to the light-exiting side 391, and the driving electrode 31 is provided at the connection side 392.

Figure 9:
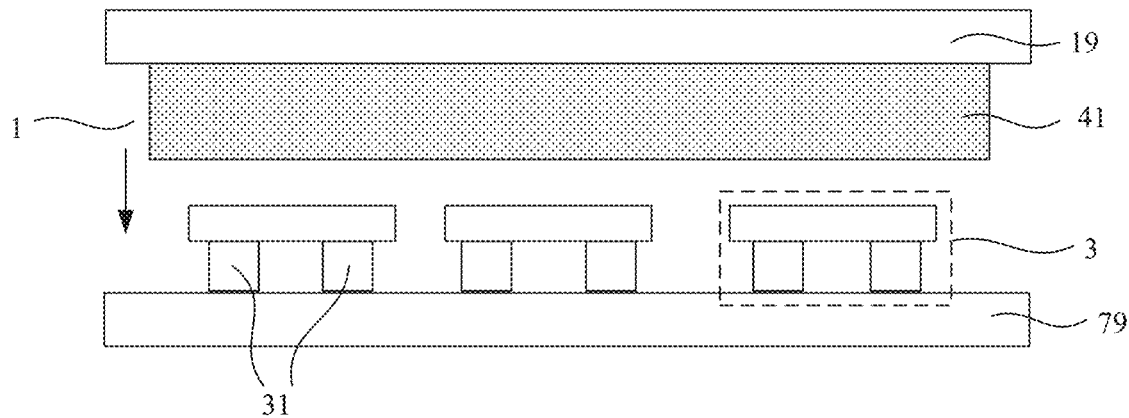
FIG. 9 is a schematic cross-sectional view of a third substrate before being connected to a first substrate in a method for fabricating an intermediate according to an embodiment of the present disclosure.

Referring to FIG. 9, in order to fabricate the intermediate substrate 1, a black photoresist layer 41 is formed on the first substrate 19 first, and then the light emitting devices 3 are disposed on the black photoresist layer 41.

The specific manner of forming the black photoresist layer 41 is various.

For example, the above described adhesive film may be attached to one side of the first substrate 19 to form the black photoresist layer 41.

For another example, the black photoresist layer 41 may be formed by deposition or the like.

In some embodiments, the step S302 of providing the plurality of light emitting devices 3 on the black photoresist layer 41 includes: S3021, forming the plurality of light emitting devices 3 on a third substrate 79; and S3022, transferring the light emitting device 3 on the third substrate 79 onto the black photoresist layer 41.

As an implementation of the embodiment of the present disclosure, the light emitting devices 3 may be provided on the black photoresist layer 41 by a "transfer" technique, particularly a massive-transfer technique. That is, a plurality of light emitting devices 3 arranged in an array are first formed on the third substrate 79 (e.g., a sapphire substrate) by a semiconductor process, and then the array of the light emitting devices 3 is "entirely moved" onto the black photoresist layer 41.

For example, referring to FIG. 9, one possible way is to make the side of the third substrate 79 having the light emitting devices 3 (at this time, the driving electrodes 31 of the light emitting devices 3 should be in contact with the third substrate 79) in direct contact with the black photoresist layer 41, and then separate the light emitting devices 3 from the third substrate 79 (for example, by light irradiation, dissolution, etc., to break the connection layer between the light emitting devices 3 and the third substrate 79), thereby transferring the light emitting devices 3 onto the black photoresist layer 41.

For another example, the light emitting devices 3 on the third substrate 79 (in this case, the light-exiting side 391 of the light emitting device is in contact with the third substrate 79) may be transferred to a transition substrate (for example, a "transfer stamp"), then the transition substrate is brought into contact with the black photoresist layer 41, and the light emitting devices 3 are separated from the transition substrate (for example, by light irradiation, dissolution, etc., to break the connection layer between the light emitting devices 3 and the transition substrate), so that the light emitting devices 3 are transferred onto the black photoresist layer 41.

Of course, it is also possible that a plurality of light emitting devices 3 are disposed on the black photoresist layer 41 by other means, for example, the light emitting devices 3 may be directly fabricated on the black photoresist layer 41.

Of course, in a case where other structures such as the first alignment mark 11 are further provided on the first substrate 19, the fabricating method in the embodiment of the present disclosure should further include a step of forming other structures such as the first alignment mark 11, and these steps can be realized by means of attaching and patterning processes, and will not be described in detail herein.

The exemplary embodiments are described in the present disclosure, and although specific terms are employed, they are used and should be interpreted in a generic and descriptive sense only and not for purposes of limitation. In some instances, features, characteristics and/or elements described in connection with a particular embodiment may be used alone or in combination with features, characteristics and/or elements described in connection with other embodiments, unless expressly stated otherwise, as would be apparent to one skilled in the art. It will, therefore, be understood by those skilled in the art that various changes in form and details may be made therein without departing from the scope of the present disclosure as set forth in the appended claims.

What is claimed is:

1. An intermediate substrate, comprising:
   a first substrate;
   a black photoresist layer on a side of the first substrate; and
   a plurality of light emitting devices on a side of the black photoresist layer away from the first substrate; wherein each of the plurality of light emitting devices has a light-exiting side for emergence of light emitted by the light emitting device, the light-exiting side is in contact with the black photoresist layer, and the light emitting device comprises a driving electrode for introducing a driving signal,
   wherein the black photoresist layer is made of a soft and deformable material,
   wherein the black photoresist layer comprises: silica gel; and carbon black distributed in the silica gel,
   wherein the first substrate is made of transparent polyimide (CPI) or transparent polyethylene terephthalate (PET).

2. The intermediate substrate of claim 1, wherein the light emitting device has a connection side opposite to the light-exiting side, and the driving electrode is provided at the connection side.

3. The intermediate substrate of claim 1, wherein the light emitting device is a light emitting diode, and the driving electrode comprises a cathode and an anode which are arranged at an interval.

4. The intermediate substrate of claim 1, wherein a thickness of the black photoresist layer is substantially the same as a thickness of the light emitting device.

5. The intermediate substrate of claim 1, wherein a first alignment mark is further provided on the first substrate.

6. The intermediate substrate of claim 1, wherein the black photoresist layer is configured to be capable of being squeezed into gaps between the plurality of light emitting devices, thereby forming the black matrix filled between the plurality of light emitting devices.

7. The intermediate substrate of claim 1, wherein the black photoresist layer has a substantially uniform thickness throughout the black photoresist layer.

8. The intermediate substrate of claim 7, wherein a thickness of a portion of the black photoresist layer in contact with the light-exiting side is substantially the same as a thickness of other portions of the black photoresist layer than the portion of the black photoresist layer.

9. The intermediate substrate of claim 1, wherein the black photoresist layer is configured to be a layer for forming a black matrix filled between the plurality of light emitting devices.

10. The intermediate substrate of claim 1, wherein a mass percentage of the carbon black in the black photoresist layer is between 10% and 80%.

11. The intermediate substrate of claim 1, wherein a thickness of the black photoresist layer is in a range of 85% to 115% with a thickness of the light emitting device being 100%.

12. A method for fabricating a display panel, comprising:
   providing a driving substrate and an intermediate substrate; wherein the driving substrate comprises a second substrate, and a driving circuit is on a side of the second substrate and comprises a plurality of driving pads; and wherein the intermediate substrate comprises: a first substrate; a black photoresist layer on a side of the first substrate; and a plurality of light emitting devices on a side of the black photoresist layer away from the first substrate, each of the plurality of light emitting devices having a light-exiting side for emergence of light emitted by the light emitting device, the light-exiting side being in contact with the black photoresist layer, and the light emitting device comprising a driving electrode for introducing a driving signal;

arranging the side of the intermediate substrate provided with the plurality of light emitting devices to face the side of the driving substrate provided with the driving circuit so as to electrically connect driving electrodes of at least some of the plurality of light emitting devices to driving pads of the plurality of driving pads; and pressing the first substrate and the second substrate to embed the light emitting device into the black photoresist layer until the light-exiting side of the light emitting device is exposed, wherein the black photoresist layer forms a black matrix.

13. The method of claim 12, wherein the light emitting device has a connection side opposite to the light-exiting side, and the driving electrode is provided at the connection side.

14. The method of claim 12, wherein a first alignment mark is further provided on the first substrate, and a second alignment mark is further provided on the second substrate; the step of arranging the side of the intermediate substrate provided with the plurality of light emitting devices to face the side of the driving substrate provided with the driving circuit, comprises:

arranging the side of the intermediate substrate provided with the plurality of light emitting devices to face the side of the driving substrate provided with the driving circuit, and aligning the first alignment mark with the second alignment mark.

15. The method of claim 12, wherein the step of pressing the first substrate and the second substrate, comprises:

pressing the first substrate and the second substrate in a heated vacuum environment; and curing the black photoresist layer in a heated inert gas environment.

16. The method of claim 12, wherein the first substrate is made of a transparent material, and the first substrate is a cover plate of the display panel.

17. The method of claim 12, wherein after the step of pressing the first substrate and the second substrate, the method further comprises: separating the first substrate from the black matrix and the light emitting device.

* * * * *